United States Patent [19]

Reichart

[11] Patent Number: 4,564,821

[45] Date of Patent: Jan. 14, 1986

[54] OFFSET CANCELLING AC LEVEL DETECTOR USING AN OSCILLATOR

[75] Inventor: Elwood C. Reichart, Chicago, Ill.

[73] Assignee: Motorola, Inc., Schaumburg, Ill.

[21] Appl. No.: 655,796

[22] Filed: Oct. 1, 1984

[51] Int. Cl.[4] .................. G01R 19/165; H03K 3/023
[52] U.S. Cl. ..................................... 331/74; 307/362; 328/146; 328/150; 331/135; 331/143; 331/179
[58] Field of Search .................. 331/65, 47, 54, 111, 331/135, 143, 153, 172, 173, 179, 74; 328/146, 148, 149, 150; 307/362, 350, 530

[56] References Cited

U.S. PATENT DOCUMENTS

| 3,477,034 | 11/1969 | Gioia et al. | 330/69 |
| 3,875,523 | 4/1975 | Wade et al. | 330/69 |
| 4,163,950 | 8/1979 | Damm et al. | 230/252 |

FOREIGN PATENT DOCUMENTS

| 1949056 | 4/1971 | Fed. Rep. of Germany . |
| 3232026 | 3/1983 | Fed. Rep. of Germany . |
| 3246176 | 6/1983 | Fed. Rep. of Germany . |
| 2353065 | 12/1977 | France . |
| 2111780 | 7/1983 | United Kingdom . |

OTHER PUBLICATIONS

Ilyukovich, A. M.; "Methods of Measuring and Reproducing Small Direct Currents"; Jan. 1979; pp. 55-57; Izmeritel 'Naya Tekhnika, No. 1; Translated Plenum Publishing Corp.

Graeme, J. G.; "Designing with Operational Amplifiers"; 1977; pp. 59-63, 154-161; McGraw Hill Book Company.

Motorola; "Linear Integrated Circuits" (Handbook); 1979 pp. 7-7, through 7-10.

Primary Examiner—Siegfried H. Grimm
Attorney, Agent, or Firm—Rolland R. Hackbart; Raymond A. Jenski

[57] ABSTRACT

An alternating current small-signal detector is disclosed in which an oscillator output frequency jumps from a first frequency of oscillation to a second frequency of oscillation in response to the alternating current signal exceeding a predetermined value. The predetermined value is maintained over changes in input offset voltages by a feedback network which changes only the oscillator duty cycle.

12 Claims, 7 Drawing Figures

OFFSET CANCELLING AC LEVEL DETECTOR USING AN OSCILLATOR

BACKGROUND OF THE INVENTION

This invention generally relates to small signal detectors and more particularly relates to an operational amplifier small signal detector operating in an offset voltage cancellation loop such that signals smaller than potential offset voltages may be detected.

In many applications a signal to be detected is of sufficiently low level that it is below or of the same magnitude as noise levels of the signal detector. This is particularly true if the detector is an operational amplifier or voltage comparator, both of which may have input voltage or current offset errors as much as 5 millivolts or 100 nanoamperes. A desired signal may be a 4 millivolt signal and may be entirely lost in the input offset voltage such that it cannot be detected.

To resolve this problem, others have developed unique circuits or amplifier strings to detect a desired signal. One such circuit employs direct current (DC) feedback to automatically adjust the threshold of a voltage comparator to remove the effects of an offset DC voltage thereby permitting detection of very small alternating current (AC) signals. However, the large time constant needed by this circuit for stability also causes an undesirable delay in circuit turn-on and in threshold adjustment for changing conditions.

Another previously known circuit modulates the weak desired signal with a strong known signal, filters and detects the product, and indicates the level of the desired signal by nulling a meter. This circuit is effective for high frequency signals but introduces complexity and expense which may be inappropriate for some applications.

In the application where a tone is to be detected from an audio signal such as the audio output of a radio receiver, a reliable and inexpensive detector which may be exposed to thermal, mechanical, and electrical stresses is desired. The invention hereinafter described has been conceived and developed to overcome these obstacles and environments.

SUMMARY OF THE INVENTION

It is therefore an object of the present invention to enable detection of small AC signals in the presence of input offset voltages.

It is a further object of the present invention to include the detecting amplifier in a feedback loop.

These and other objects are achieved in the present invention which is a small-signal alternating current level detector. An oscillator with a natural frequency of f1 has an input port through which a signal of a frequency other than f1 may be coupled to the oscillator. When this input signal exceeds a predetermined magnitude, the oscillator changes to a frequency of f2. A feedback signal is developed to maintain the predetermined magnitude of input signal required for oscillator frequency change.

DETAILED DESCRIPTION OF THE PREFERRED EMBODIMENT

Figure 1:
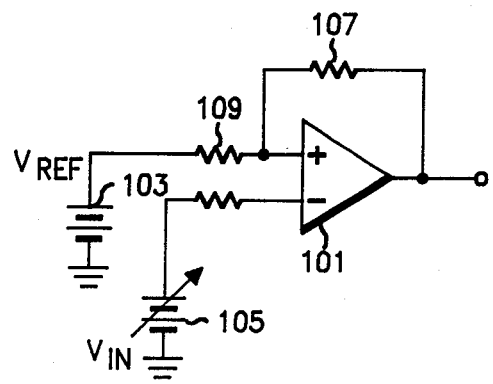
FIG. 1 is a schematic diagram of a conventional DC voltage comparator.

One common use of operational amplifiers is that of voltage comparison. A voltage comparator in its simplest form is shown in FIG. 1. A high gain operational amplifier 101 is shown in a configuration in which a reference voltage 103 is compared to an input voltage 105 to produce an output on the output terminal of operational amplifier 101. The magnitude of the output signal is controlled by the supply voltage and the comparator threshold voltage is set by the ratio of resistors 107 and 109 and $V_{REF}$103.

At very low signal amplitudes, the conventional voltage comparator shown in FIG. 1 experiences a degradation of signal detection capability by an input offset voltage intrinsic to all operational amplifiers and specific to operational amplifier 101. If the input offset voltage is greater than the desired input signal level, the input signal will not activate the comparator. In the past this DC input offset voltage has been compensated by way of DC and low frequency feedback to remove the effects of the DC offset voltage and permit detection of very small AC signals. However, changes in temperature or other environmental conditions may negate the feedback and again overwhelm the desired input voltage.

Figure 2:
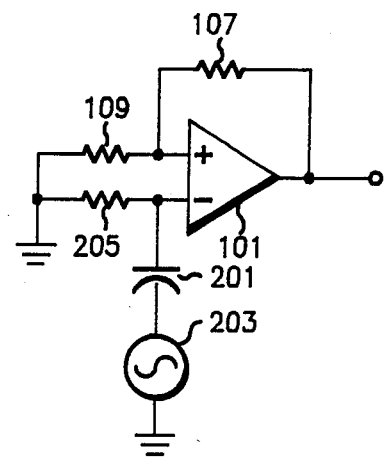
FIG. 2 is a schematic diagram of a conventional AC peak-to-peak level detector.

In the circuit of FIG. 2, a capacitor 201 has been added to the circuit of FIG. 1 as a series input element for coupling an AC signal from generator 203 to the inverting input of operational amplifier 101. In conjunction with resistor 205, which is returned to a signal ground reference level, the circuit of FIG. 1 becomes a conventional AC peak-to-peak level detector with the output signal level being determined by the maximum and minimum voltages available to the operational amplifier 101. For a given supply voltage, the detection level is set by the ratio of feedback resistors 107 and 109. In FIG. 2 the input offset voltage between the inverting and non-inverting inputs of the operational amplifier 101 will cause an error in the peak-to-peak detection threshold. Furthermore, any imbalance in the currents flowing through resistors 109 and 205 will produce difference voltage drops which will also change the detection threshold.

Figure 3:
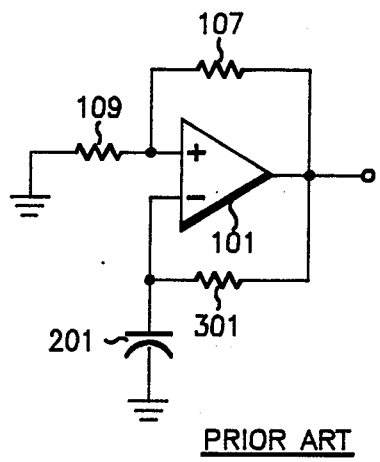
FIG. 3 is a schematic diagram of a square wave oscillator.

An oscillator may be formed by supplying feedback having an appropriate phase shift to the non-inverting input. The circuit of FIG. 3 is such an oscillator. Feedback of a signal to the operational amplifier 101 active device input is accomplished with resistor 301. Resistor 301 in combination with capacitor 201 create a 180° phase shift in the feedback signal at one frequency of AC signal proportional to the product of resistor 301 and capacitor 201 values. The circuit oscillates at this 180° phase shift frequency.

This type of oscillator has a number of characteristics in addition to generating a square wave signal which are valuable to the present invention. This oscillator is well suited to very low frequency operation because both the capacitor 201 and resistor 301 may be made very large. Furthermore, relatively large voltage drops appearing across resistors 109 and 301 are compensated in this circuit by a proportional shift in duty cycle of the oscillator output square wave. The same compensation occurs for an input offset voltage appearing between the inverting and the non-inverting inputs of operational amplifier 101.

It should be noted that during oscillation a square wave appears at the non-inverting input having a peak-to-peak voltage level which is dependent only upon the supply voltage and the ratio of resistors 107 and 109. The peak-to-peak voltage level does not change as a result of changes in frequency, voltage errors, or changes in oscillator duty cycle. This ratio of resistor 107 to resistor 109 can be selected from a wide range of values. For one circuit employing the present invention a resistor ratio of approximately eight hundred to one was selected to yield a square wave amplitude of ±4.75 millivolts (or 9.5 peak-to-peak) at the non-inverting input of operational amplifier 101. The signal at the inverting input is a triangular wave having a peak-to-peak voltage essentially the same as the peak-to-peak square wave at the non-inverting input.

Values for resistor 301 and capacitor 201 may be selected to yield a frequency of oscillation of 0.8 Hertz with a duty cycle of approximately 50%. A circuit thus constructed has been tested with a 600 millivolt DC error voltage applied to either the inverting or non-inverting input of the operational amplifier 101 to simulate a 60 to 1 error-to-signal voltage ratio. This large offset error resulted in a shift in output square wave duty cycle of approximately 10% and approximately a 2% change in the level of the ±4.75 millivolt signal at the non-inverting input.

Resistor ratios of resistors 107 and 109 may be adjusted for an order of magnitude smaller input signal. When this ratio is realized, a 600 millivolt DC offset signal will produce a 3.6% change in input oscillation signal level.

Figure 4:
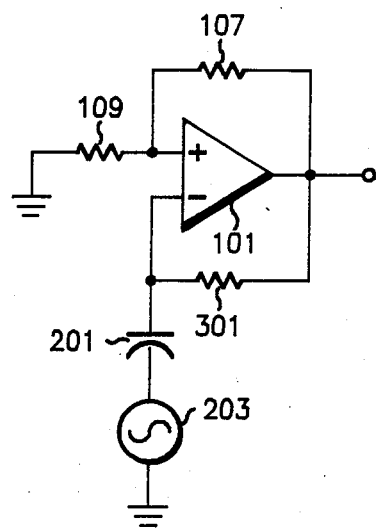
FIG. 4 is a schematic diagram of the square wave oscillator and AC level detector of the present invention in which the input signal is coupled to the inverting input.

In order to produce an offset cancelling AC level detector in accordance with the present invention, the AC input signal to be detected, generated by signal generator 203, is placed in series with capacitor 201 as shown in FIG. 4. This signal generator 203 must have a low output impedance relative to capacitor 201 such that capacitor 201 continues to be returned to signal ground. For AC input signals that are smaller than the referenced square wave at the non-inverting input (9.5 millivolts peak-to-peak in the preferred embodiment) the circuit of FIG. 4 will continue to function as a low frequency square wave oscillator as shown in FIG. 3.

If the AC input signal generator 203 produces levels that are greater than the square wave peak-to-peak reference level at the non-inverting input of operational amplifier 101, the oscillator shifts from the frequency determined by the phase shift of resistor 301 and capacitor 201 to the frequency of the incoming AC signal. If the AC input signal has a frequency significantly different than the frequency of oscillation and a level greater than the square wave peak-to-peak reference level, the oscillator will appear to jump in frequency from the oscillator free-running frequency determined by resistor 301 and capacitor 201 to the frequency of the input signal. It is this sudden jump in frequency (which in the preferred embodiment is at least an order of magnitude in frequency) that is the indication of the AC signal exceeding a threshold defined by the peak-to-peak reference level.

Operating bias for the operational amplifier 101 in FIG. 4 is the sum of all DC voltages at the inputs of the operational amplifier. These voltages are the voltage across resistor 109 resulting from the non-inverting input current, the voltage across resistor 301 resulting from the inverting input current, the input offset voltage between the non-inverting and the inverting inputs of the operational amplifier 101, and the DC component of voltage across capacitor 201. The voltage across capacitor 201 is exactly equal to but opposite in polarity to the sum of the other voltages. This balance is continuously maintained by the average DC component of current through resistor 301 which is proportional to the changing duty cycle of the square wave at the operational amplifier 101 output which in turn is related to any imbalance between a DC voltage across capacitor 201 and the remaining voltages, thereby completing the feedback loop. Thus offset errors are cancelled by the change in oscillator duty cycle with negligible effect on frequency or peak-to-peak amplitude of oscillation.

If the AC signal generator 203 has a zero DC component with respect to signal ground and a high output impedance, it may be input to the non-inverting input of amplifier 101 rather than in series with capacitor 201 on the inverting input. The AC level detector behaves the same in either configuration and either configuration may be used to implement the present invention.

Figure 5:
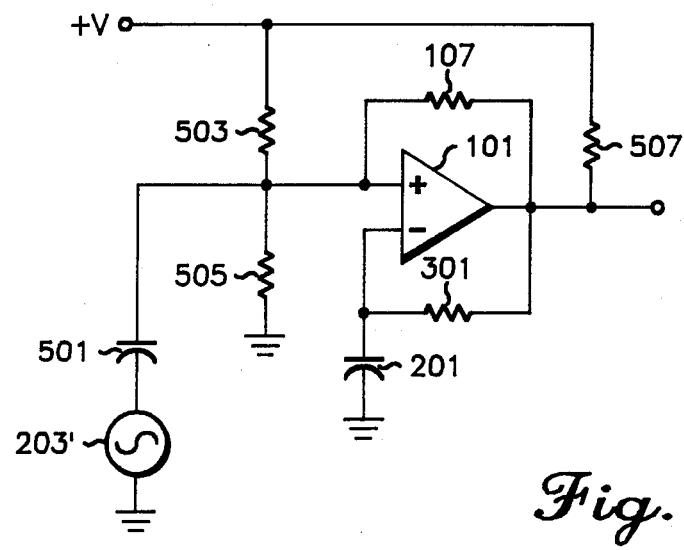
FIG. 5 is a schematic diagram of the square wave oscillator and AC level detector of the present invention in which the input signal is coupled to the non-inverting input.

The circuit of FIG. 5 shows a small signal AC level detector in accordance with the present invention in which the AC signal is applied to the non-inverting input. In this embodiment the operational amplifier 101 may be an LM 339 quad comparator available from Motorola, Inc., but may be any similar comparator or differential amplifier. The AC input signal, of 31.2 KHz in the preferred embodiment, is input from high impedance generator 203' via coupling capacitor 501 to the non-inverting input of operational amplifier 101. The input impedance is determined by resistors 503 and 505 which are effectively in parallel to the AC input signal and are equivalent to resistor 109 in FIG. 4. As previously described, the free running frequency of oscillation is determined by resistor 301 and capacitor 201. The level of detection is proportional to the input impedance and resistor 107. A load resistor 507 determines the output impedence of the detector.

Figure 6:
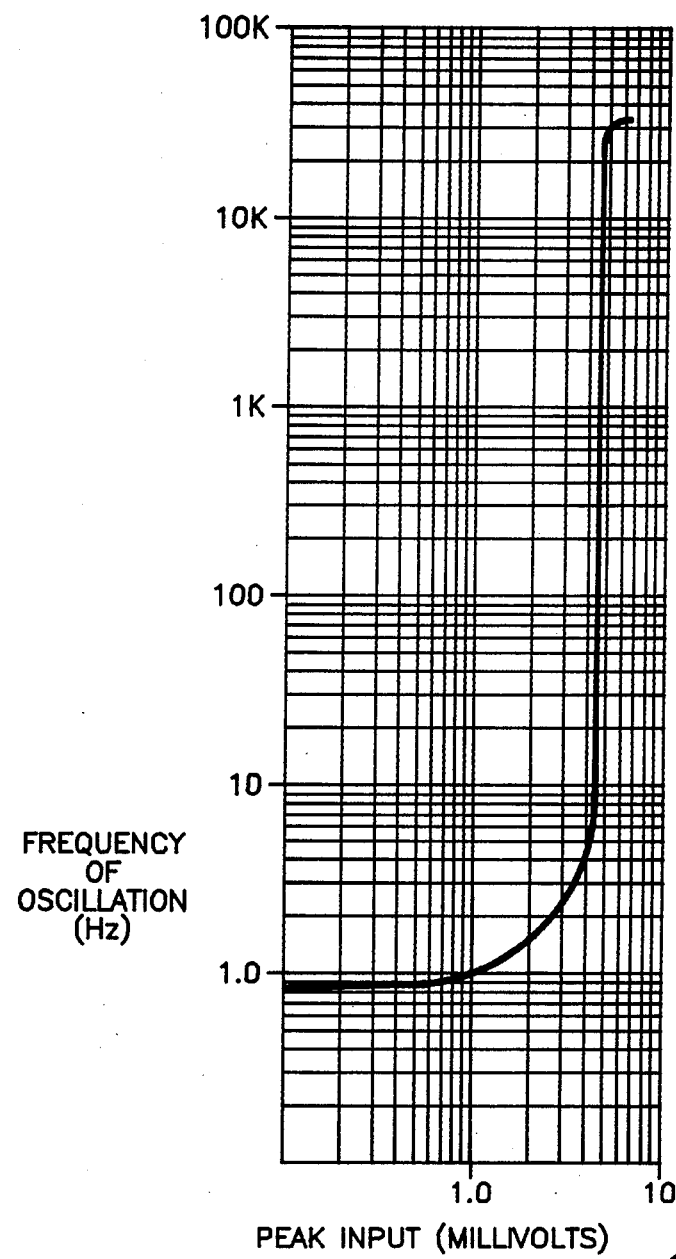
FIG. 6 is a response curve of the output signal frequency plotted against input signal level.

A response curve is shown in FIG. 6 for the circuit shown in FIG. 5. It can be seen that for input signal levels below approximately ±4.50 millivolts, the frequency of oscillation is approximately that of the natural frequency of oscillation. For input signal levels greater than ±4.87 millivolts, the frequency of oscillation is approximately that of the AC input signal (31.2 KHz). Thus, it can be seen that a "jump" in frequency occurs in a 0.4 millivolt range such that a signal of ±4.75 millivolts may be detected even though the offset voltage may be as much as ±5.0 millivolts and would otherwise prevent detection of a ±4.75 millivolt signal.

Figure 7:
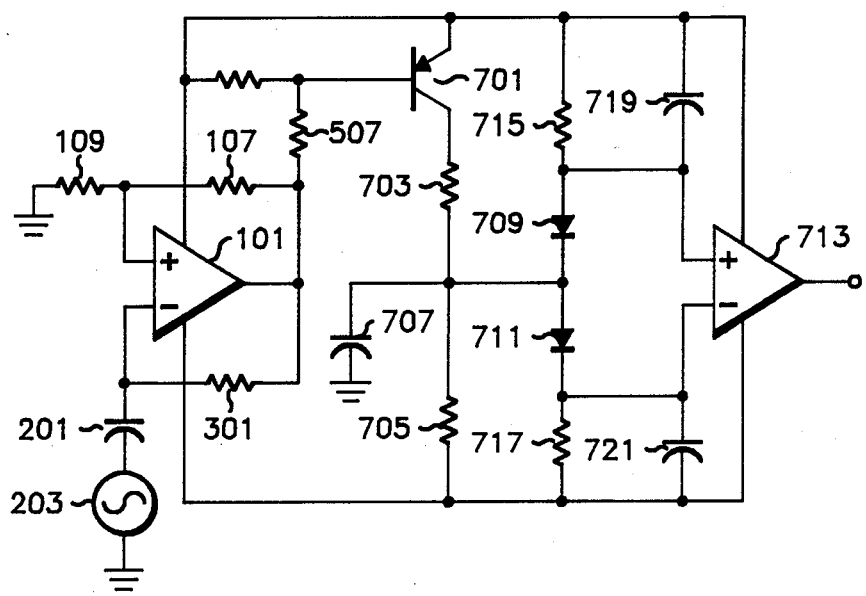
FIG. 7 is a schematic diagram of a square wave oscillator, AC level detector, and frequency sensitive detector of the present invention.

In FIG. 7, employing the inverting input signal feed configuration, the AC level detector is coupled to a frequency-to-voltage converter which transforms the jump in frequency to a DC level change. Specifically, the output of the AC level detector is coupled to a transistor switch 701 which has approximately a 50% duty cycle depending upon the output signal from operational amplifier 101. With a typical plus and minus five volt power supply, the value of collector resistor 703 may be chosen such that the current is 1 milliampere when transistor 701 is saturated and zero when the transistor 701 is cut off. Resistor 705 to the negative supply may be chosen such that the current is 0.5 milliamperes. It can be proven that the current into capacitor 707 is either +0.5 milliamperes or −0.5 milliamperes depending upon the output of operational amplifier 101. The voltage across the capacitor is essentially a triangular waveform having an amplitude inversely related to the size of the capacitor and the frequency of the current. A high frequency input such as the 31.2 KHz caused by signal source 203 yields a significantly lower voltage across capacitor 707 than the 0.8 Hz free running frequency of operational amplifier 101. The voltage across capacitor 707 is peak detected by diodes 709 and 711 and applied to operational amplifier 713, which may also be a LM 339 comparator. The peak detected low frequency signal causes the output of amplifier 713 to be in a logic low state, which rises to a logic high state when the high frequency signal is present. Thus a DC indication of the presence of the 31.2 KHz input signal is provided. Resistors 715 and 717 and capacitors 719 and 721 provide bias and low pass filter elements for the operation of amplifier 713.

Thus, an improvement of technology in detecting AC signal levels that are smaller than an input error voltage is shown in the present invention. This invention places the input offset error voltages within a feedback loop such that the effects of the offset voltages on signal detection thresholds are continuously and automatically reduced. Signal detection threshold stability is achieved with offset voltages more than an order of magnitude greater than the signal to be detected. While particular embodiments of the present invention have been shown and described, it should be understood that the invention is not limited thereto, for modification of form may be created by those skilled in the art without departing from the true spirit and scope of the basic underlying principles of the present invention. It is therefore contemplated to cover by the present application any and all such modifications to the present invention disclosed and claimed herein.

I claim:

1. A small-signal level detector circuit for detecting an input alternating current (AC) signal, comprising:
   an oscillator generating an output signal having a first frequency, said oscillator having an input port for accepting the input AC signal having a frequency other than said first frequency of said output signal;
   means, coupled to said oscillator, for changing said output signal first frequency to a second frequency when the input AC signal has a magnitude greater than a predetermined magnitude, thereby detecting said input AC signal; and
   means for developing a feedback signal coupled to said oscillator means to maintain said predetermined magnitude.

2. A small-signal level detector circuit in accordance with claim 1, wherein said input AC signal frequency is greater than said first frequency of said output signal.

3. A small-signal level detector circuit in accordance with claim 1, wherein said second frequency output signal is essentially equal to said input AC signal frequency.

4. A small-signal level detector circuit in accordance with claim 1, wherein said level detector circuit further comprises means for detecting said output signal frequency change, thereby indicating presence of said input AC signal greater than said predetermined magnitude.

5. A small-signal level detector circuit for detecting an input alternating current (AC) signal, comprising:
   oscillator means generating an output signal having a first frequency, said oscillator means having an input port for accepting the input AC signal of a frequency other than said first frequency of said output signal;
   means, coupled to said oscillator means, for changing said output signal first frequency to a second frequency when the input AC signal has a magnitude greater than a predetermined magnitude; and
   means for detecting said output signal frequency change, thereby indicating presence of the input AC signal greater than said predetermined magnitude.

6. A signal level detector circuit in accordance with claim 5, wherein said small-signal level detector circuit further comprises means for developing a feedback signal coupled to said oscillator means to maintain said predetermined magnitude.

7. A small-signal level detector circuit in accordance with claim 5, wherein said input signal frequency is greater than said first frequency of said output signal.

8. A small-signal level detector circuit in accordance with claim 5, wherein said second frequency output signal is essentially equal to said input signal frequency.

9. A method of detecting a small-signal alternating current (AC) signal comprising the steps of:
   generating an output signal having a first frequency;
   accepting the AC signal having a frequency other than said first frequency of said output signal;
   changing said output signal to a second frequency when the AC signal has a magnitude greater than a predetermined magnitude; and
   detecting said output signal frequency change, thereby indicating presence of the AC signal greater than said predetermined magnitude.

10. A method in accordance with the method of claim 9 further comprising the step of developing a feedback signal to maintain said predetermined magnitude.

11. A method of detecting a small-signal alternating current (AC) signal comprising the steps of:
   generating an output signal having a first frequency;
   accepting the AC signal having a frequency other than said first frequency of said output signal;
   changing said output signal to a second frequency when the AC signal has a magnitude greater than a predetermined magnitude; and
   developing a feedback signal to maintain said predetermined magnitude.

12. A method in accordance with the method of claim 11 further comprising the step of detecting said output signal frequency change, thereby indicating presence of the AC signal greater than said predetermined magnitude.

* * * * *